United States Patent
Kumar

(10) Patent No.: US 8,131,248 B2
(45) Date of Patent: Mar. 6, 2012

(54) MIXER WITH LOCAL OSCILLATOR FEED-FORWARD AND METHOD OF MIXING SIGNALS WITH LOCAL OSCILLATOR FEED-FORWARD

(75) Inventor: Sushil Kumar, Fremont, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 640 days.

(21) Appl. No.: 12/244,091

(22) Filed: Oct. 2, 2008

(65) Prior Publication Data
US 2010/0087159 A1 Apr. 8, 2010

(51) Int. Cl.
*H04B 1/26* (2006.01)
(52) U.S. Cl. .......... 455/318; 455/334; 333/125
(58) Field of Classification Search .......... 455/205, 455/208, 255, 313, 318, 319, 323, 325, 326, 455/334; 333/109, 117, 118, 125, 128, 136
See application file for complete search history.

(56) References Cited

U.S. PATENT DOCUMENTS

| 5,732,345 | A | 3/1998 | Vice | |
|---|---|---|---|---|
| 7,590,177 | B2 * | 9/2009 | Yu | 375/238 |
| 2004/0092245 | A1 * | 5/2004 | Katz | 455/326 |

FOREIGN PATENT DOCUMENTS

WO 97/23033 6/1997

* cited by examiner

*Primary Examiner* — Nhan Le

(57) ABSTRACT

A feed-forward device is provided for a mixer including a diplexer having a radio frequency port, an intermediate frequency port, and a common port; and a mixing circuit receiving an in-phase local oscillator signal and an out-of-phase local oscillator signal and having an output coupled to the common port of the diplexer. The feed-forward device includes: a first signal sampler having an input adapted to sample the in-phase local oscillator signal and to output a sampled in-phase local oscillator signal; a second signal sampler having an input adapted to sample the out-of-phase local oscillator signal and to output a sampled out-of-phase local oscillator signal; and an arrangement for coupling the sampled in-phase local oscillator signal and the sampled out-of-phase local oscillator signal to the common port of the diplexer.

20 Claims, 7 Drawing Sheets

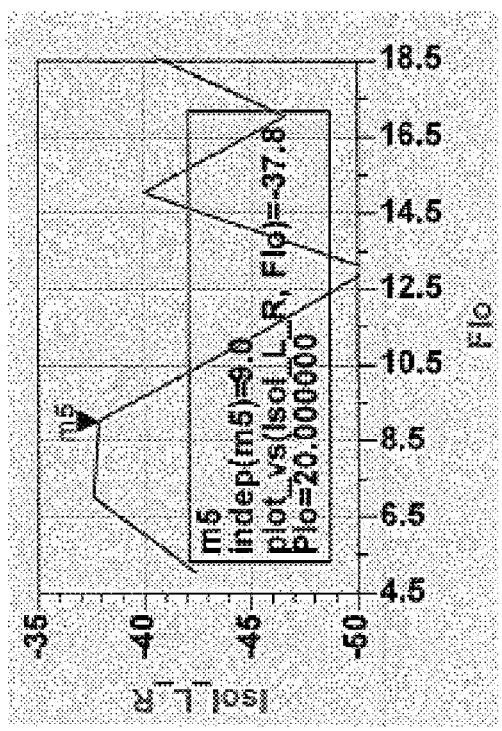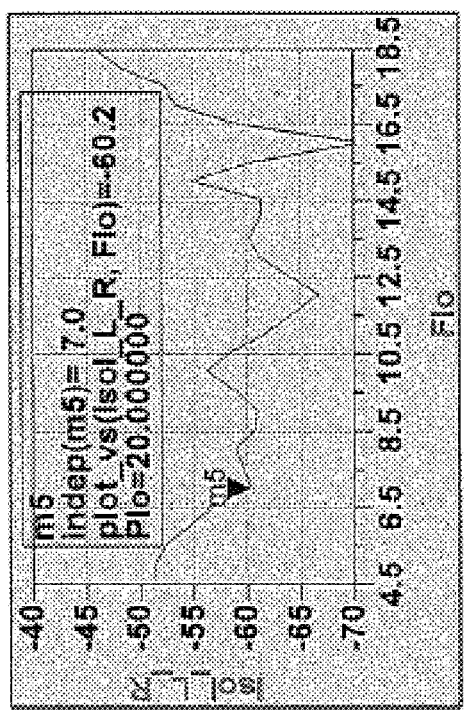
FIG. 6A
FIG. 6B

MIXER WITH LOCAL OSCILLATOR FEED-FORWARD AND METHOD OF MIXING SIGNALS WITH LOCAL OSCILLATOR FEED-FORWARD

BACKGROUND

Frequency mixers may be included in many types of electronic systems. For example, frequency mixers in radio systems downconvert a received radio frequency (RF) signal by combining the RF signal with a local oscillator (LO) signal. The combination of the RF signal and the LO signal yields an intermediate frequency (IF) signal, which has a frequency corresponding to a difference between the RF and LO signals. Also, a frequency mixer may be employed to combine a modulated IF signal with an LO signal to upconvert the IF signal to a desired RF frequency for transmission. In some systems, a mixer may be employed for both upconversion of a transmit signal and downconversion of a receive signal.

Some important parameters of a mixer's performance include conversion loss, compression point, third-order intercept point (IP3), and port-to-port isolation. The values of these parameters normally depend on a variety of factors, including the mixer topology and the performance of the components employed in the mixer (e.g., diodes, field effect transistors (FETs), etc.). For example, in general a diode mixer exhibits a greater conversion loss and a moderate IP3 compared to a FET mixer, but generally has better LO-RF port isolation (lower LO leakage to the RF port) than an FET mixer over a broad frequency band.

If there is a need for lower LO leakage at the RF port, in general a balanced mixer topology is employed.

FIG. 1 is a block diagram of a mixer 100, which includes LO-port 110 for receiving an LO signal, RF-port 120 for inputting a received RF signal (and/or for outputting an RF signal for transmission) and IF-port 130 for outputting a downconverted IF signal (and/or for receiving an IF signal to be upconverted for transmission). The mixer 100 also includes a balun 105, a mixing circuit 115 comprising first and second mixing devices 125 and 135, and a diplexer 145.

Balun 105 is provided to improve LO-port isolation, and to reduce LO energy leakage to RF port 120. Balun 105 has an unbalanced LO-port 110 receiving an unbalanced LO signal, and provides a balanced LO output, comprising an in-phase LO signal on in-phase LO output 105a and an out-of-phase LO signal on out-of-phase LO output 105b. In a beneficial arrangement, the in-phase LO signal and the out-of-phase LO signal have substantially the same amplitude as each other, and the out-of-phase LO signal is phase shifted by about 180 degrees with respect to the in-phase LO signal.

First and second mixing devices 125/135 each have a first port 125a/135a and a second port 125b/135b. Input ports 125a/135a are connected respectively to in-phase and out-of-phase LO outputs 105a and 105b.

Diplexer 145 has RF-port 120, IF-port 130, and a common port 145a. Common port 145a of diplexer 145 is connected to second ports 125b/135b of first and second mixing devices 125/135 via common node "C."

Diplexer 145 performs frequency separation to enable RF and IF signals to be received and sent on different frequencies.

In mixer 100, balun 105 is employed to cancel out LO leakage thru mixing circuit 115 at common node C. Because the LO signal is fed to mixing circuit 115 through balun 105, which ideally provides in-phase and out-of-phase LO signals that are 180 degrees out of phase with respect to each other, any LO signals that leaks through first and second mixing devices 125/135 cancel each other out at common node "C."

However, in practice, it is not possible to produce an ideal balun, and a real balun has some amount of amplitude and phase imbalance between the in-phase LO signal and the out-of-phase LO signal. As a result of this imbalance, the LO leakages through first and second mixing devices 125/135 do not cancel each other out exactly at common node "C." As a result, some LO energy leaks onto RF port 120. The amount of LO leakage at RF port 120 depends on the amount of phase and amplitude imbalance in balun 105.

FIGS. 2A-C are graphs illustrating simulated local oscillator (LO) isolation for the mixer of FIG. 1 as a function of frequency for different levels of phase imbalance in balun 105. FIG. 2A illustrates a case where the phase imbalance is 0 degrees (ideal balance). In that case, it can be seen that the LO-to-RF port (L-R) isolation is extremely high—between 230-300 dB over a frequency range from about 4-20 GHz. FIG. 2B illustrates a case where the phase imbalance is only 1 degree. In that case, it can be seen that the L-R isolation has been reduced so as to be between 49-56 dB over a frequency range from about 4-20 GHz. FIG. 2C illustrates a case where the phase imbalance is 5 degrees. In that case, it can be seen that the L-R isolation has been reduced so as to be between 33-40 dB over a frequency range from about 4-20 GHz.

From FIGS. 2A-C, it can be seen that L-R isolation is very sensitive to balun performance.

With mixer 100, it is possible to achieve L-R isolation of 45-50 dB or more over a narrow frequency bandwidth by fine tuning the balun to have a phase imbalance of about 1% over the narrow frequency band. However, over a wide frequency bandwidth, a phase imbalance of 5% is considered to be very good, and this typically only yields L-R isolation numbers in the range of 30-40 dB. Nevertheless, for many applications, an L-R isolation of >25 dB is considered acceptable, and so the mixer 100 is able to meet these requirements. Furthermore, some manufacturers employ a bandpass filter after the mixer if greater LO rejection is required.

However, with the growing demand for new applications and lower cost devices, there is an increasing desire to minimize the number of filters employed, and there is a demand for broadband mixers with greater L-R isolation.

To improve L-R isolation, a mixer may apply a slight DC offset at the IF to cancel out balun imperfections.

FIG. 3 illustrates a test set-up for a mixer 300 employing a DC offset. Mixer 300 employs bias-tees 302 and 304 to add first and second DC offset voltages to first and second IF signals from first and second IF signal generators 332 and 334. LO signal generator 312 provides an LO signal to LO-port 310, and an RF output at RF-port 320 is coupled to the input 372 of a spectrum analyzer 370.

FIG. 4 illustrates improvement in LO isolation that can be provided by the mixer of FIG. 3 when appropriate DC voltages are applied to the bias-tees 302 and 304. The left side of FIG. 4 shows the LO and RF levels at spectrum analyzer 370 when no DC offset voltages are applied to bias-tees 302 and 304. The right side of FIG. 4 shows the LO and RF levels at spectrum analyzer 370 when selected DC offset voltages are applied to bias-tees 302 and 304. As can be seen in FIG. 4, the LO level at RF port 320 can be substantially improved by applying appropriate voltages to bias-tees 302 and 304.

Although L-R isolation may be improved in theory by the arrangement of FIG. 3, the arrangement is quite sensitive and requires continuous adjustment to the DC offset voltages when there are any changes to any environmental conditions, such as due to temperature, aging of components, etc. Accordingly, this arrangement is not very effective for a wide range of operating conditions.

So it would be desirable to provide an arrangement which can reduce LO leakage to an RF port of a mixer. It would further be desirable to provide such an arrangement which can operate over a wide frequency bandwidth and a wide range of operating conditions.

SUMMARY

In a representative embodiment, a mixer comprises: a balun having a local oscillator input and having an in-phase local oscillator output and an out-of-phase local oscillator output; a diplexer having a radio frequency port, an intermediate frequency port, and a common port; a first mixing device having a first port coupled to the in-phase local oscillator output of the balun, and a second port coupled to the common port of the diplexer; a second mixing device having a first port coupled to the out-of-phase local oscillator output of the balun, and a second port coupled to the common port of the diplexer; a first signal sampler having an input coupled to the in-phase local oscillator output of the balun, and providing a sampled in-phase local oscillator signal; a second signal sampler having an input coupled to the out-of-phase local oscillator output of the balun, and providing a sampled out-of-phase local oscillator signal; and means for coupling the sampled in-phase local oscillator signal and the sampled out-of-phase local oscillator signal to the common port of the diplexer.

In another representative embodiment, a method is provided for operating a mixer including a diplexer having a radio frequency port, an intermediate frequency port, and a common port; and a mixing circuit receiving an in-phase local oscillator signal and an out-of-phase local oscillator signal and having an output coupled to the common port of the diplexer. The method comprises: sampling the in-phase local oscillator signal; sampling the out-of-phase local oscillator signal; combining the sampled in-phase local oscillator signal and sampled out-of-phase local oscillator signal to produce a feed-forward local oscillator signal; and coupling the feed-forward local oscillator signal to the common port of the diplexer so as to be substantially out-of-phase with a leakage local oscillator signal produced at the common port of the diplexer by the mixing circuit.

In another representative embodiment, a feed-forward device is provided for a mixer including a diplexer having a radio frequency port, an intermediate frequency port, and a common port; and a mixing circuit receiving an in-phase local oscillator signal and an out-of-phase local oscillator signal and having an output coupled to the common port of the diplexer. The feed-forward device comprises: a first signal sampler having an input adapted to sample the in-phase local oscillator signal and to output a sampled in-phase local oscillator signal; a second signal sampler having an input adapted to sample the out-of-phase local oscillator signal and to output a sampled out-of-phase local oscillator signal; and means for coupling the sampled in-phase local oscillator signal and the sampled out-of-phase local oscillator signal to the common port of the diplexer.

BRIEF DESCRIPTION OF THE DRAWINGS

The example embodiments are best understood from the following detailed description when read with the accompanying figures. It is emphasized that the various features are not necessarily drawn to scale. In fact, the dimensions may be arbitrarily increased or decreased for clarity of discussion. Wherever applicable and practical, like reference numerals refer to like elements.

FIG. 6A is a graph illustrating the local oscillator (LO) isolation for the mixer of FIG. 1.

FIG. 6B is a graph illustrating the local oscillator (LO) isolation for the mixer of FIG. 5.

DETAILED DESCRIPTION

In the following detailed description, for purposes of explanation and not limitation, representative embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

Furthermore, as used herein, the term "radio frequency" or "RF" pertains to VHF, UHF, microwave and even millimeter wave frequencies to the extent that technology permits the devices and circuits disclosed herein to be fabricated and operated at such frequencies. Also, unless otherwise noted, when a first device is said to be connected to, or coupled to, a node, signal, or second device, this encompasses cases where one or more intervening or intermediate devices may be employed to connect or couple the first device to the node, signal, or second device. However, when a first device is said to be "directly connected" or "directly coupled" to a node, signal, or second device, then it is understood that the first device is connected or coupled to the node, signal, or second device without any intervening or intermediate devices interposed therebetween.

Moreover, when used herein the context of describing a value or range of values, the terms "about" and "approximately" will be understood to encompass variations of +/−10% with respect to the nominal value or range of values.

Figure 5:
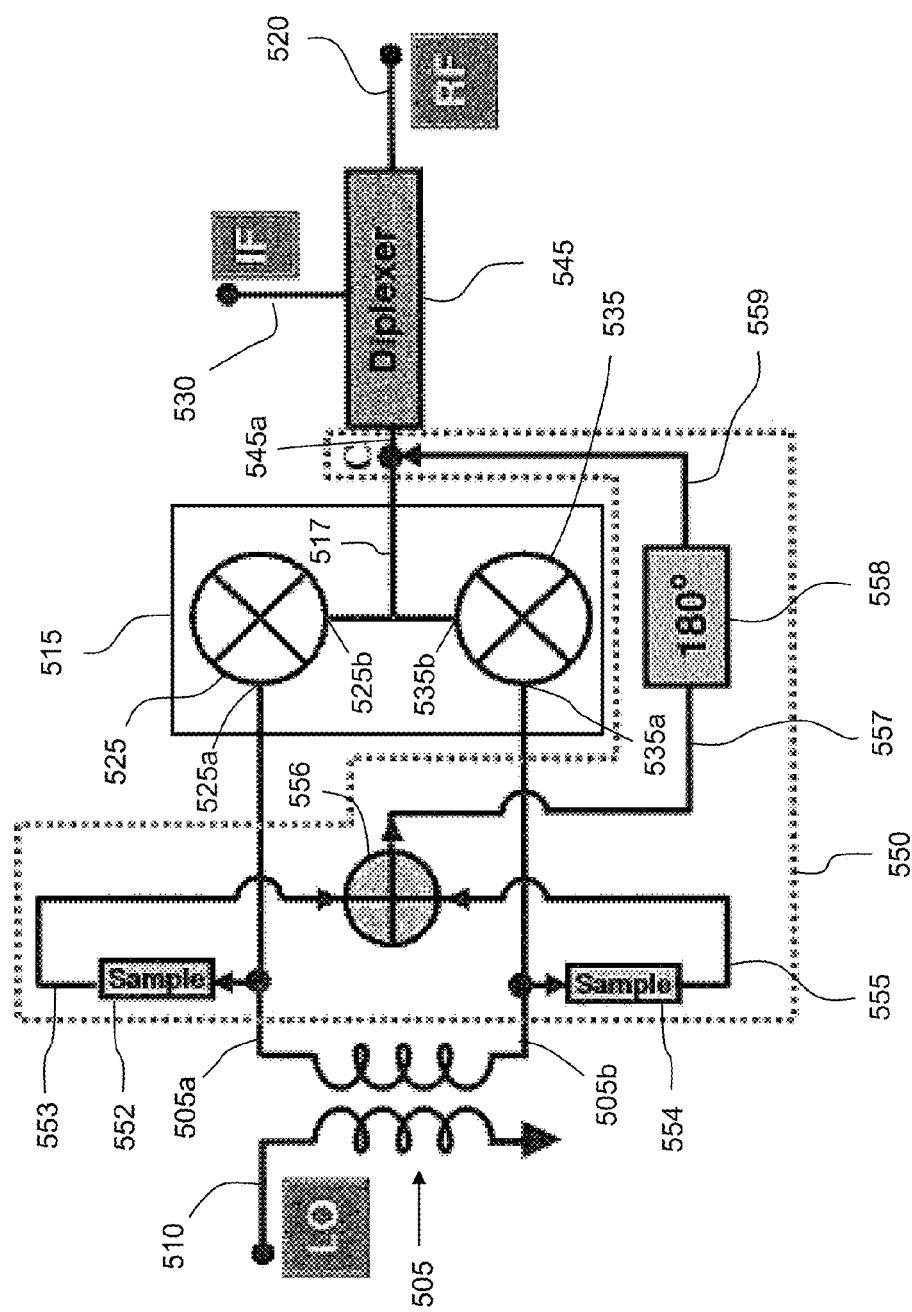
FIG. 5 is a block diagram illustrating a mixer according to a representative embodiment.

FIG. 5 is a block diagram illustrating a mixer 500 according to a representative embodiment. Mixer 500 includes LO-port 510 for receiving an LO signal, RF-port 520 for inputting a received RF signal (and/or for outputting an RF signal for transmission) and IF-port 530 for outputting a downconverted IF signal (and/or for receiving an IF signal to be upconverted for transmission). Mixer 500 also includes a balun 505, a mixing circuit 515 comprising first and second mixing devices 525 and 535, a diplexer 545, and a feed-forward circuit 550.

Balun 505 has an unbalanced LO-port 510 receiving an unbalanced LO signal, and provides a balanced LO output, comprising an in-phase LO signal on in-phase LO output 505a, and an out-of-phase LO signal on out-of-phase LO output 505b. In a beneficial arrangement, the in-phase LO signal and the out-of-phase LO signal have substantially the same amplitude as each other, and the out-of-phase LO signal is phase shifted by about 180 degrees with respect to the in-phase LO signal. In one embodiment, LO-port 510 is adapted to receive a local oscillator signal in a frequency range of 4 to 20 GHz.

First and second mixing devices 525/535 each have a first port 525a/535a and a second port 525b/535b. Input ports 525a/535a are coupled respectively to in-phase and out-of-phase LO outputs 505a and 505b.

In one embodiment, first and second mixing devices 525 and 535 are each reflective switches. In another embodiment, first and second mixing devices 525 and 535 are transmissive devices.

Diplexer 545 has RF-port 520, IF-port 530, and a common port 545a. Common port 545a of diplexer 545 is connected to second ports 525b/535b of first and second mixing devices 525/535 via common node "C."

Feed-forward circuit 550 includes a first signal sampler 552, a second signal sampler 554, a combiner 556, and a phase shifter 558.

First signal sampler 552 has an input coupled to the in-phase LO output 505a of balun 505, and produces a sampled in-phase local oscillator signal 553. Second signal sampler 554 has an input coupled to the out-of-phase LO output 505b of balun 505, and produces a sampled out-of-phase local oscillator signal 555. In some embodiments, the sampled in-phase local oscillator signal is at a level of from −20 dB to −40 dB with respect to the in-phase local oscillator signal, and the sampled out-of-phase local oscillator signal is at a level of from −20 dB to −40 dB with respect to the out-of-phase local oscillator signal. In one particular embodiment the sampled in-phase local oscillator signal is at a level of about −30 dB with respect to the in-phase local oscillator signal, and the sampled out-of-phase local oscillator signal is at a level of about −30 dB with respect to the out-of-phase local oscillator signal. In some embodiments, first and second signal samplers 552 and 554 may each comprise an RC sampling circuit.

Combiner 556 combines the sampled in-phase LO signal 553 and the sampled out-of-phase LO signal 555 and produces a combined sampled LO signal 557.

Phase shifter 558 has an input coupled to receive the combined sampled LO signal 557, and shifts the phase of the combined sampled local oscillator signal by about 180 degrees to provide a phase-shifted combined sampled LO signal 559. The output of phase shifter 588 is connected to common node "C" and common port 545a of diplexer 545 to provide the phase-shifted combined sampled LO signal 559 to common node "C" and common port 545a.

In effect, combiner 556 and phase shifter 558 form a means for coupling the sampled in-phase local oscillator signal 553 and the sampled out-of-phase local oscillator signal 555 to the common node "C" and common port 545a of diplexer 545.

In one embodiment, combiner 546 is a "wired-and" connection where the sampled in-phase LO signal and the sampled out-of-phase LO signal are coupled together to produce a feed-forward local oscillator signal which is provided to the common node C and common port 545a of diplexer 545. In alternative embodiments, other appropriate signal combiners, such as power combiners, may be employed.

In one embodiment, combiner 556 and phase shifter 558 comprise a common-source field effect transistor circuit having a gate connected to receive the sampled in-phase local oscillator signal and the sampled out-of-phase local oscillator signal from first and second signal samplers 552 and 554, and having a drain coupled to common port 545a of diplexer 545.

In operation, first and second signal samplers 552 and 554 sample the in-phase and out-of-phase local oscillator signals from balun 505. Since the in-phase and out-of-phase local oscillator signals are about 180 degrees out-of-phase with respect to each other, the combined LO signal 557 from combiner 556 is actually a difference signal. This combined LO signal 557 is fed-forward to common node "C" through phase shifter 558. Due to imbalances of balun 505, mixing circuit 515 produces a leakage local oscillator signal at common port 545a of diplexer 545. The feed-forward local oscillator signal 559 is substantially out-of-phase with a leakage local oscillator signal 517 produced by mixing circuit 515. Therefore common node "C" acts as a combiner or summation node for feed-forward local oscillator signal 559 and leakage local oscillator signal 517 produced by mixing circuit 515. Therefore, feed-forward local oscillator signal 559 at least partially cancels out leakage local oscillator signal 517 produced by mixing circuit 515, thereby improving the L-R isolation of mixer 500

Figure 1:
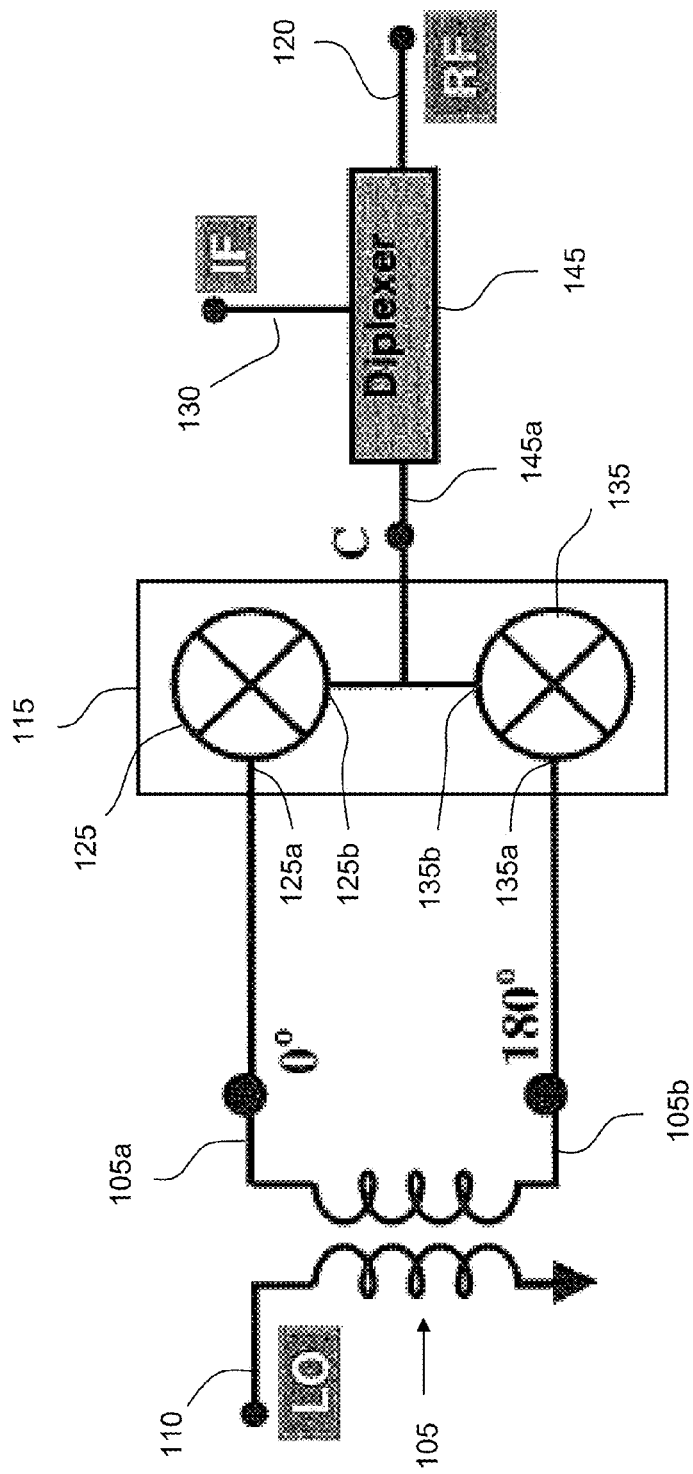
FIG. 1 is a block diagram illustrating a conventional mixer.
Figure 2A:
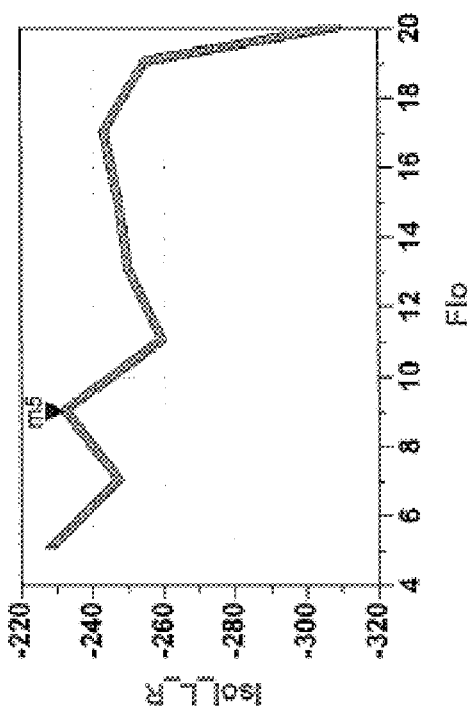
FIGS. 2A-C are graphs illustrating simulated local oscillator (LO) isolation for the mixer of FIG. 1 as a function of frequency for different levels of phase imbalance.
Figure 2B:
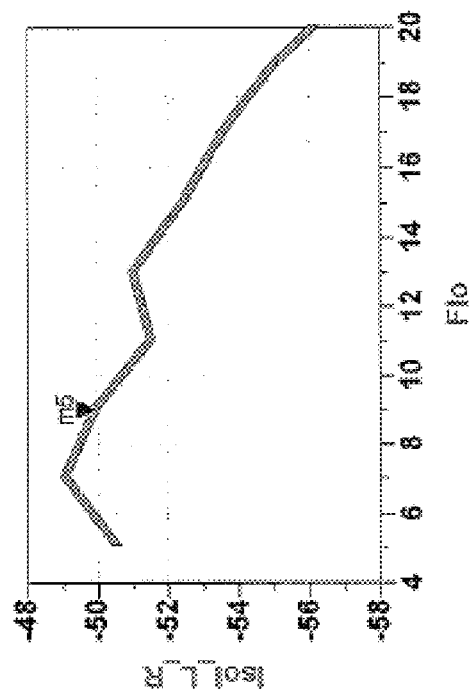
Figure 2C:
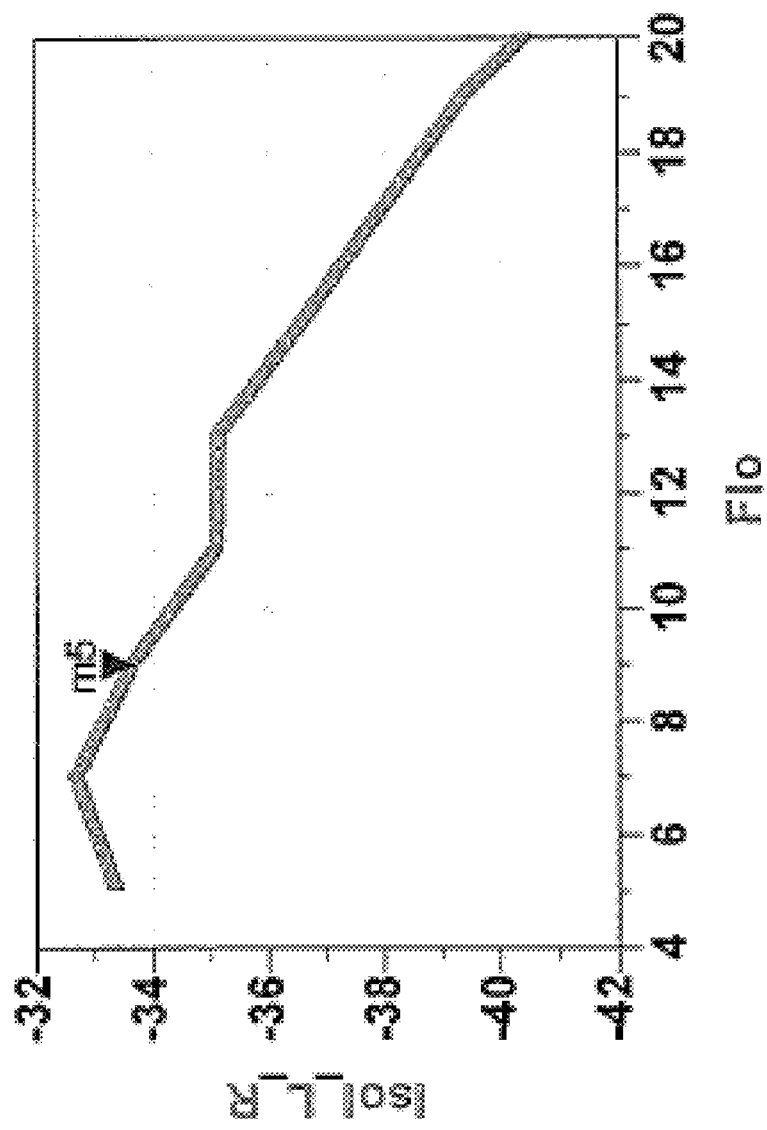
Figure 3:
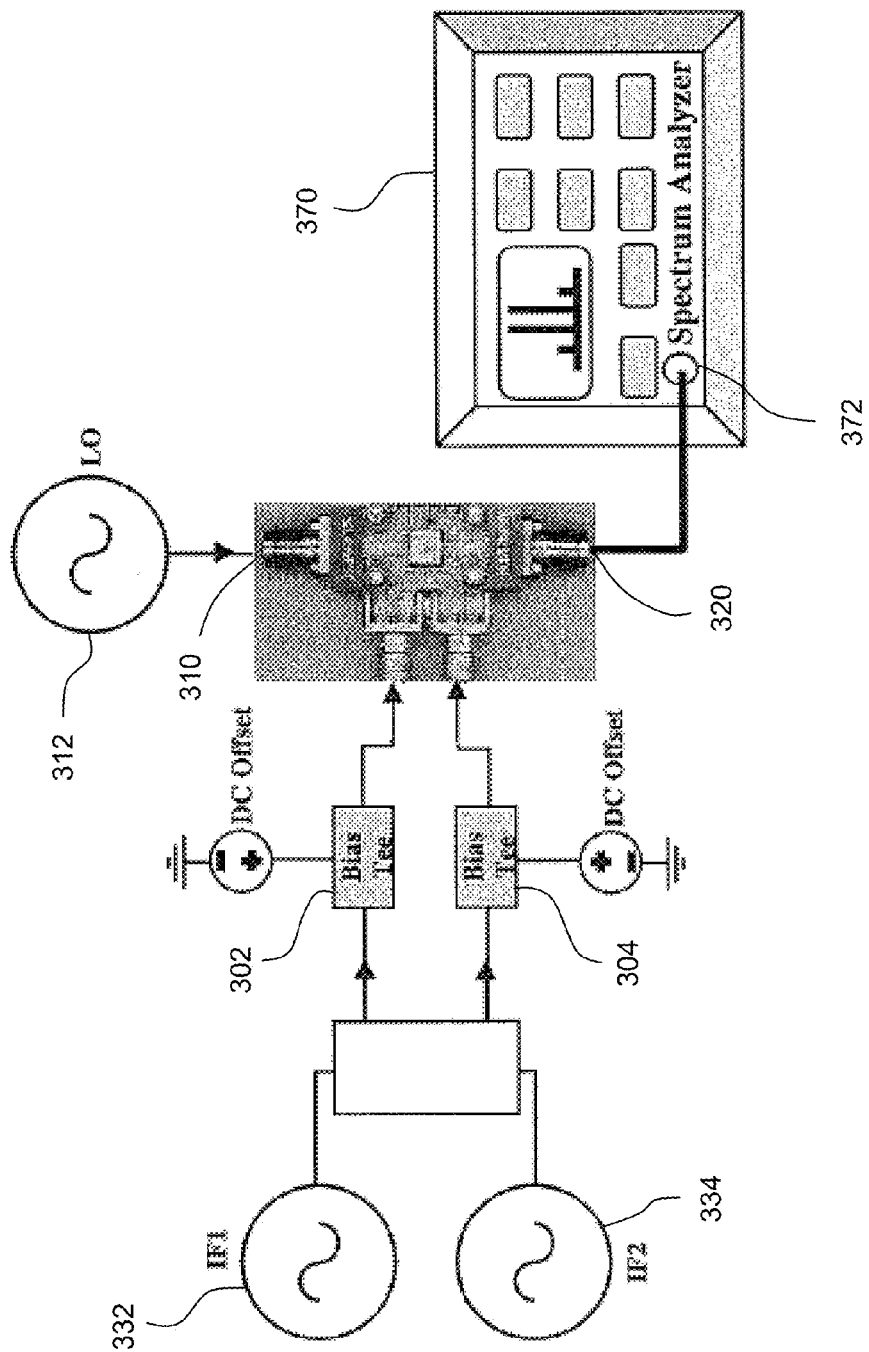
FIG. 3 illustrates a test set-up for a mixer employing a DC offset.
Figure 4:
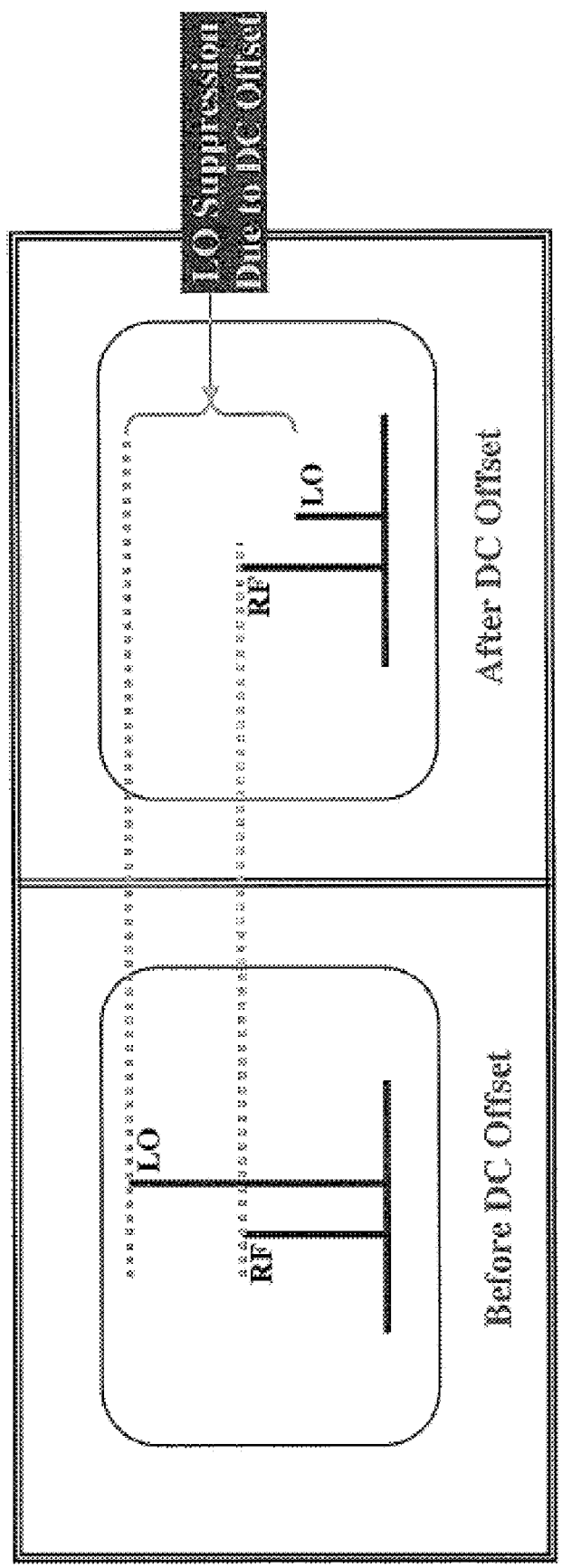
FIG. 4 illustrates improvement in LO isolation that can be provided by the arrangement of FIG. 3.

FIG. 6A is a graph illustrating the local oscillator (LO) isolation for mixer 100 of FIG. 1, which is similar to mixer 500 of FIG. 5, but does not include feed-forward circuit 550. As can be seen in FIG. 6A, the L-R isolation ranges from about 38-50 dB over a frequency range from about 4.5-18.5 GHz.

FIG. 6B is a graph illustrating the local oscillator (LO) isolation for mixer 500 of FIG. 5 which includes feed-forward circuit 550. As can be seen in FIG. 6B, the L-R isolation ranges from about 46-70 dB over a frequency range from about 4.5-18.5 GHz, and is greater than 50 dB from about 4.5-18 GHz. This represents a significant improvement over mixer 100.

While example embodiments are disclosed herein, one of ordinary skill in the art appreciates that many variations that are in accordance with the present teachings are possible and remain within the scope of the appended claims. For example, depending on the particular configuration of the mixing circuit and various phase shifts experienced by the LO signal therein, a phase shift of something other than 180 degrees—or even no phase shift at all—may be applied to the sampled in-phase and out-of-phase LO signals in order to get the desired LO cancellation of the leakage current from the mixing circuit at the common node "C" and the common port of the diplexer. After a careful reading of the teachings of this specification and the drawings provided together herewith, such variations would be recognized by those of skill in the art. The embodiments therefore are not to be restricted except within the scope of the appended claims.

The invention claimed is:
1. A mixer, comprising:
a balun having a local oscillator input and having an in-phase local oscillator output and an out-of-phase local oscillator output;
a diplexer having a radio frequency port, an intermediate frequency port, and a common port;
a first mixing device having a first port coupled to the in-phase local oscillator output of the balun, and a second port coupled to the common port of the diplexer;
a second mixing device having a first port coupled to the out-of-phase local oscillator output of the balun, and a second port coupled to the common port of the diplexer;
a first signal sampler having an input coupled to the in-phase local oscillator output of the balun, and providing a sampled in-phase local oscillator signal;

a second signal sampler having an input coupled to the out-of-phase local oscillator output of the balun, and providing a sampled out-of-phase local oscillator signal; and means for coupling the sampled in-phase local oscillator signal and the sampled out-of-phase local oscillator signal to the common port of the diplexer.

2. The mixer of claim 1, wherein the means for coupling combines the sampled in-phase local oscillator signal and the sampled out-of-phase local oscillator signal and provides a combined sampled local oscillator signal, and wherein the means for coupling includes a phase shifter having an input coupled to receive the combined sampled local oscillator signal, the phase shifter shifting a phase of the combined sampled local oscillator signal by about 180 degrees to provide a phase-shifted combined sampled local oscillator signal to the common port of the diplexer.

3. The mixer of claim 1, wherein the means for coupling comprises a common-source field effect transistor circuit having a gate connected to receive the sampled in-phase local oscillator signal and the sampled out-of-phase local oscillator signal, and having a drain coupled to the common port of the diplexer.

4. The mixer of claim 1, wherein the first and second mixing devices are each reflective switches.

5. The mixer of claim 1, wherein the first and second mixing devices are each transmissive switches.

6. The mixer of claim 1, wherein the sampled in-phase local oscillator signal is at a level of from −20 dB to −40 dB with respect to the in-phase local oscillator signal, and the sampled out-of-phase local oscillator signal is at a level of from −20 dB to −40 dB with respect to the out-of-phase local oscillator signal.

7. The mixer of claim 1, wherein the local oscillator input is adapted to receive a local oscillator signal in a frequency range of 4 to 20 GHz.

8. A method of operating a mixer including a diplexer having a radio frequency port, an intermediate frequency port, and a common port; and a mixing circuit receiving an in-phase local oscillator signal and an out-of-phase local oscillator signal and having an output coupled to the common port of the diplexer, the method comprising:

sampling the in-phase local oscillator signal;

sampling the out-of-phase local oscillator signal;

combining the sampled in-phase local oscillator signal and sampled out-of-phase local oscillator signal to produce a feed-forward local oscillator signal; and coupling the feed-forward local oscillator signal to the common port of the diplexer so as to be substantially out-of-phase with a leakage local oscillator signal produced at the common port of the diplexer by the mixing circuit.

9. The method of claim 8, wherein coupling the feed-forward local oscillator signal to the common port of the diplexer includes phase-shifting the feed-forward local oscillator signal by about 180 degrees.

10. The method of claim 8, wherein combining the sampled in-phase local oscillator signal and sampled out-of-phase local oscillator signal to produce a feed-forward local oscillator signal comprises providing the sampled in-phase local oscillator signal and sampled out-of-phase local oscillator signal to a gate of a common-source field effect transistor circuit.

11. The method of claim 10, wherein coupling the feed-forward local oscillator signal to the common port of the diplexer comprises coupling a drain of the common-source field effect transistor circuit to the common port of the diplexer.

12. The method of claim 8, wherein the sampled in-phase local oscillator signal is at a level of from −20 dB to −40 dB with respect to the in-phase local oscillator signal, and the sampled out-of-phase local oscillator signal is at a level of from −20 dB to −40 dB with respect to the out-of-phase local oscillator signal.

13. The method of claim 8, wherein the sampled in-phase local oscillator signal is at a level of about −30 dB with respect to the in-phase local oscillator signal, and the sampled out-of-phase local oscillator signal is at a level of about −30 dB with respect to the out-of-phase local oscillator signal.

14. The method of claim 8, wherein the in-phase local oscillator signal and the out-of-phase local oscillator signal each have a frequency in a frequency range of 4 to 20 GHz.

15. For a mixer including a diplexer having a radio frequency port, an intermediate frequency port, and a common port; and a mixing circuit receiving an in-phase local oscillator signal and an out-of-phase local oscillator signal and having an output coupled to the common port of the diplexer, a feed-forward device comprising:

a first signal sampler having an input adapted to sample the in-phase local oscillator signal and to output a sampled in-phase local oscillator signal;

a second signal sampler having an input adapted to sample the out-of-phase local oscillator signal and to output a sampled out-of-phase local oscillator signal; and means for coupling the sampled in-phase local oscillator signal and the sampled out-of-phase local oscillator signal to the common port of the diplexer.

16. The device of claim 15, wherein the means for coupling combines the sampled in-phase local oscillator signal and the sampled out-of-phase local oscillator signal to provide a combined sampled local oscillator signal, and wherein the means for coupling includes a phase shifter having an input coupled to receive the combined sampled local oscillator signal, the phase shifter shifting a phase of the combined sampled local oscillator signal by about 180 degrees to provide a phase-shifted combined sampled local oscillator signal to the common port of the diplexer.

17. The device of claim 15, wherein the means for coupling comprises a common-source field effect transistor circuit having a gate connected to receive the sampled in-phase local oscillator signal and the sampled out-of-phase local oscillator signal, and having a drain coupled to the common port of the diplexer.

18. The device of claim 15, wherein the sampled in-phase local oscillator signal is at a level of from −20 dB to −40 dB with respect to the in-phase local oscillator signal, and the sampled out-of-phase local oscillator signal is at a level of from −20 dB to −40 dB with respect to the out-of-phase local oscillator signal.

19. The device of claim 15, wherein the sampled in-phase local oscillator signal is at a level of about −30 dB with respect to the in-phase local oscillator signal, and the sampled out-of-phase local oscillator signal is at a level of about −30 dB with respect to the out-of-phase local oscillator signal.

20. The device of claim 15, wherein the in-phase local oscillator signal and the out-of-phase local oscillator signal each have a frequency in a frequency range of 4 to 20 GHz.

* * * * *